(12) United States Patent
Chen et al.

(10) Patent No.: US 12,543,608 B2
(45) Date of Patent: Feb. 3, 2026

(54) DISPLAY DEVICE AND DISPLAY APPARATUS

(71) Applicant: Coretronic Corporation, Hsin-Chu (TW)

(72) Inventors: Chien-Chih Chen, Hsin-Chu (TW); Ming-Wei Tsai, Hsin-Chu (TW); Chung-Jen Ou, Hsin-Chu (TW); Yu-Min Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 379 days.

(21) Appl. No.: 18/310,538

(22) Filed: May 2, 2023

(65) Prior Publication Data
US 2023/0369299 A1 Nov. 16, 2023

Related U.S. Application Data

(60) Provisional application No. 63/340,949, filed on May 12, 2022.

(30) Foreign Application Priority Data

May 31, 2022 (CN) .......................... 202221337672.8
Sep. 30, 2022 (CN) .......................... 202222608160.7

(51) Int. Cl.
*H01L 25/075* (2006.01)
*H10H 20/851* (2025.01)
*H10H 20/855* (2025.01)

(52) U.S. Cl.
CPC ....... *H01L 25/0753* (2013.01); *H10H 20/851* (2025.01); *H10H 20/855* (2025.01)

(58) Field of Classification Search
CPC . H01L 25/0753; H01L 25/167; H10H 20/851; H10H 20/855; H10H 20/841;
(Continued)

(56) References Cited

U.S. PATENT DOCUMENTS 9,507,206 B2 11/2016 Li
2012/0182527 A1 7/2012 Enomoto et al.
(Continued)

FOREIGN PATENT DOCUMENTS

CN 103278876 9/2013
CN 110471210 11/2019
(Continued)

OTHER PUBLICATIONS

"Office Action of related U.S. Appl. No. 17/583,241", issued on Oct. 23, 2024, p. 1-p. 16.

*Primary Examiner* — Cuong B Nguyen
(74) *Attorney, Agent, or Firm* — JCIPRNET

(57) ABSTRACT

A display device including a light source module and a wavelength conversion module is provided. The light source module includes a substrate, a plurality of first LED elements and a second LED element. The first LED elements are configured for providing a plurality of first color lights, and the second LED element is configured for providing a second color light. The wavelength conversion module is overlapped and arranged on the light source module, and the wavelength conversion module includes a wavelength conversion element and at least one dichroic filter layer. The wavelength conversion element is configured to absorb the first color lights emitted by a part of the first LED elements and excite a converted light beam, wherein a color of the converted light beam is different from that of the first color lights and the second color light.

20 Claims, 2 Drawing Sheets

(58) Field of Classification Search
CPC ..... H10H 20/8514; H10H 29/855–856; H10K 50/85–865
See application file for complete search history.

(56) References Cited

U.S. PATENT DOCUMENTS

| | | | |
|---|---|---|---|
| 2019/0131350 A1* | 5/2019 | Kwak | ................ H10K 59/875 |
| 2019/0140016 A1 | 5/2019 | Hwang et al. | |
| 2019/0267357 A1 | 8/2019 | Guchi et al. | |
| 2020/0006387 A1 | 1/2020 | Moon et al. | |
| 2020/0287103 A1 | 9/2020 | Maegawa et al. | |
| 2021/0134878 A1 | 5/2021 | Wu et al. | |
| 2021/0135064 A1 | 5/2021 | Ishio | |
| 2022/0149025 A1 | 5/2022 | Plank | |

FOREIGN PATENT DOCUMENTS

| | | |
|---|---|---|
| EP | 3483933 | 5/2019 |
| TW | 201407207 | 2/2014 |
| TW | 596428 | 8/2017 |
| TW | 201933317 | 8/2019 |
| TW | 202011060 | 3/2020 |

\* cited by examiner

DISPLAY DEVICE AND DISPLAY APPARATUS

CROSS-REFERENCE TO RELATED APPLICATION

This application claims a priority benefit of U.S. provisional application Ser. No. 63/340,949, filed on May 12, 2022, China Application No. 202221337672.8, filed on May 31, 2022 and China Application No. 202222608160.7, filed on Sep. 30, 2022. The entirety of the above-mentioned patent application is hereby incorporated by reference herein and made a part of this specification.

BACKGROUND

Technical Field

The invention relates to a display device and a display apparatus.

Description of Related Art

Most of micro display panels made of micro light-emitting diodes (micro-LEDs) are monochrome. In order to achieve full-color projection with red, blue, and green colors, micro-LEDs with red, blue, and green colors are generally required, or blue light emitted by the blue micro LEDs is subjected to color conversion through a red quantum dot material and a green quantum dot material to generate red light and green light are required to achieve a full color effect. However, the color conversion implemented through the red quantum dot material or the green quantum dot material requires performing two semiconductor photolithography processes on the two different quantum dot materials, which is difficult to achieve required accuracy at a micro structure scale. On the other hand, since red and green quantum dot materials need to be used for color conversion, it is difficult to reduce the production cost.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention is directed to a display device, the display device uses blue and green micro-LEDs as a back plate, and only uses a red quantum dot material to perform color conversion on blue lights emitted by blue micro-LEDs, so as to implement a miniature full-color screen.

An embodiment of the invention provides a display apparatus, a display device of the display apparatus uses blue and green micro-LEDs as a back plate, and only uses a red quantum dot material to perform color conversion on blue lights emitted by blue micro-LEDs, so as to implement a miniature full-color screen.

Other objects and advantages of the invention may be further illustrated by the technical features broadly embodied and described as follows.

An embodiment of the invention provides a display device including a light source module and a wavelength conversion module. The light source module includes a substrate, a plurality of first light-emitting diodes and a second light-emitting diode, where the first light-emitting diodes and the second light-emitting diode are arranged on a surface of the substrate in an array. The first light-emitting diodes are configured for providing a plurality of first color lights, and the second light-emitting diode is configured for providing a second color light. The wavelength conversion module is overlapped and arranged on the light source module, and the wavelength conversion module includes an isolation structure layer, a wavelength conversion element and at least one dichroic filter layer, where the isolation structure layer has a first surface facing the light source module and a second surface opposite to the first surface, and a plurality of light channels penetrating through the first surface and the second surface, and the first light-emitting diodes and the second light-emitting diode respectively correspond to the light channels. The wavelength conversion element is overlapped with a part of the first light-emitting diodes and is disposed in a first part of the light channels, and an orthogonal projection of the first part of the light channels on the surface of the substrate is overlapped with an orthogonal projection of the part of the first light-emitting diodes on the surface of the substrate. The wavelength conversion element is configured to absorb the first color lights emitted by the part of the first light-emitting diodes and excite a converted light beam, where a color of the converted light beam is different from that of the first color lights and the second color light. The at least one dichroic filter layer is disposed on the second surface of the isolation structure layer and is overlapped with the wavelength conversion element, wherein the converted light beam penetrates through the at least one dichroic filter layer, and the at least one dichroic filter layer reflects other color lights to the wavelength conversion element.

In an embodiment of the invention, the first light-emitting diodes are blue micro light-emitting diodes, and the first color lights are blue light beams.

In an embodiment of the invention, the second light-emitting diode is a green micro light-emitting diode, and the second color light is a green light beam.

In an embodiment of the invention, the converted light beam is a red light beam.

In an embodiment of the invention, wavelengths of the first color lights is less than 500 nm.

In an embodiment of the invention, a wavelength of the second color light is between 500 nm and 600 nm.

In an embodiment of the invention, a wavelength of the converted light beam is greater than 600 nm.

In an embodiment of the invention, a material of the isolation structure layer includes a light absorbing material, a metal material with high reflectivity or a non-metal material with high reflectivity.

In an embodiment of the invention, the wavelength conversion element is quantum dot material or nanophosphor.

In an embodiment of the invention, the display device further includes a transparent glass sheet located on the second surface of the isolation structure layer, the transparent glass sheet is overlapped with the light channels, and the at least one dichroic filter layer is located between the transparent glass sheet and the isolation structure layer.

In an embodiment of the invention, the display device further includes: a microlens structure layer, the microlens structure layer includes a plurality of microlenses arranged in an array, and positions of the microlenses respectively correspond to the light channels for respectively converging or collimating the first color lights, the second color light and the converted light beam penetrating through the at least one dichroic filter layer.

In an embodiment of the invention, a quantity ratio of the part of the first light-emitting diodes, the other part of the first light-emitting diodes and the second light-emitting diode is 2:1:1.

In an embodiment of the invention, an orthogonal projection of a second part of the light channels on the surface of the substrate is overlapped with an orthogonal projection of the other part of the first light-emitting diodes and the second light-emitting diode on the surface of the substrate, and the second part of the light channels is a cavity, or filled with a transparent material.

An embodiment of the invention provides a display apparatus including a plate and a plurality of display devices arranged on the plate in an array. Each of the display devices includes a light source module and a wavelength conversion module. The light source module includes a substrate, a plurality of first light-emitting diodes and a second light-emitting diode, wherein the first light-emitting diodes and the second light-emitting diode are arranged on a surface of the substrate in an array. The first light-emitting diodes are configured for providing a plurality of first color lights, and the second light-emitting diode is configured for providing a second color light. The wavelength conversion module is overlapped and arranged on the light source module, and the wavelength conversion module includes an isolation structure layer, a wavelength conversion element and at least one dichroic filter layer, wherein the isolation structure layer has a first surface facing the light source module and a second surface opposite to the first surface, and a plurality of light channels penetrating through the first surface and the second surface, and the first light-emitting diodes and the second light-emitting diode respectively correspond to the light channels. The wavelength conversion element is overlapped with a part of the first light-emitting diodes and is disposed in a first part of the light channels, and an orthogonal projection of the first part of the light channels on the surface of the substrate is overlapped with an orthogonal projection of the part of the first light-emitting diodes on the surface of the substrate. The wavelength conversion element is configured to absorb the first color lights emitted by the part of the first light-emitting diodes and excite a converted light beam, wherein a color of the converted light beam is different from that of the first color lights and the second color light. The at least one dichroic filter layer is disposed on the second surface of the isolation structure layer and is overlapped with the wavelength conversion element, wherein the converted light beam penetrates through the dichroic filter layer, and the dichroic filter layer reflects other color lights to the wavelength conversion element.

In an embodiment of the invention, the first light-emitting diodes are blue micro light-emitting diodes, the first color lights are blue light beams, the second light-emitting diode is a green micro light-emitting diode, the second color light is a green light beam, and the converted light beam is a red light beam.

In an embodiment of the invention, a quantity ratio of the part of the first light-emitting diodes, the other part of the first light-emitting diodes and the second light-emitting diode is 2:1:1.

In an embodiment of the invention, the wavelength conversion element is quantum dot material or nanophosphor.

In an embodiment of the invention, each of the display devices further includes: a transparent glass sheet located on the second surface of the isolation structure layer, the transparent glass sheet is overlapped with the light channels, and the at least one dichroic filter layer is located between the transparent glass sheet and the isolation structure layer.

In an embodiment of the invention, each of the display devices further includes: a microlens structure layer, the microlens structure layer includes a plurality of microlenses arranged in an array, and positions of the microlenses respectively correspond to the light channels for respectively converging or collimating the first color lights, the second color light and the converted light beam penetrating through the at least one dichroic filter layer.

In an embodiment of the invention, an orthogonal projection of a second part of the light channels on the surface of the substrate is overlapped with an orthogonal projection of another part of the first light-emitting diodes and the second light-emitting diode on the surface of the substrate, and the second part of the light channels is a cavity, or filled with a transparent material.

Based on the above description, in the display device and the display apparatus of the invention, the display device uses blue and green micro light-emitting diodes as the back plate, and only uses the red quantum dot material to perform color conversion on the blue lights emitted by the blue micro-LEDs, so as to achieve a miniature full-color screen, which may effectively reduce manufacturing processes, improve a product yield and reduce the production cost.

To make the aforementioned more comprehensible, several embodiments accompanied with drawings are described in detail as follows.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "left," "right," "front," "back," etc., is used with reference to the orientation of the Figure(s) being described and are not intended to be limiting of the invention.

Figure 1:
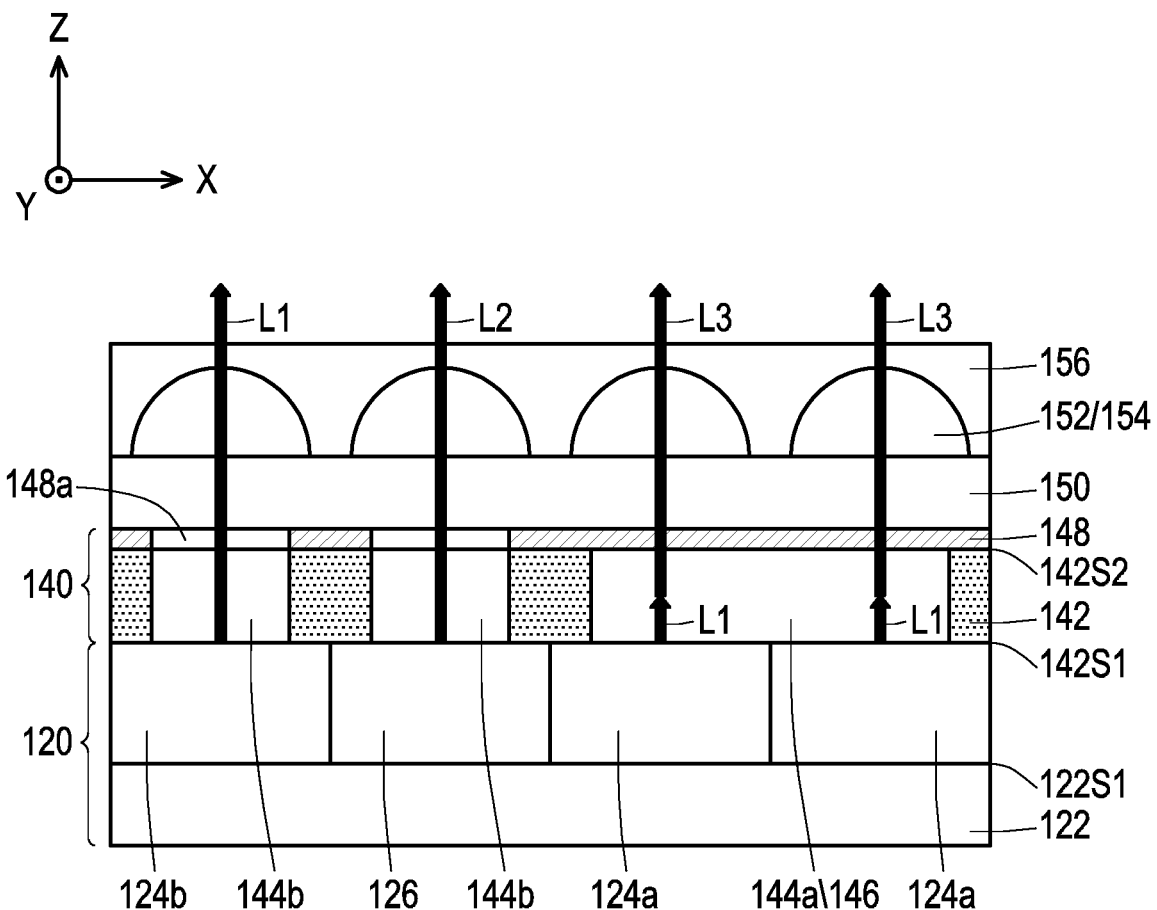
FIG. 1 is a schematic diagram of a display device according to an embodiment of the invention.

FIG. 1 is a schematic diagram of a display device according to an embodiment of the invention.

As shown in FIG. 1, the display device 100 includes a light source module 120 and a wavelength conversion module 140.

The light source module 120 includes a substrate 122, a plurality of first LED elements 124 and a second LED element 126. The first LED elements 124 and the second LED element 126 are disposed on a surface 122S1 of the substrate 122 in an array. The first LED elements 124 are configured to provide a plurality of first color lights L1, and the second LED element 126 is configured to provide a second color light L2. A light-emitting direction of the first LED elements 124 and the second LED element 126 is along Z direction, i.e., a normal direction of the surface 122S1 of the substrate 122.

In the embodiment, the substrate 122 may include a pixel circuit layer, and the pixel circuit layer is configured for individually driving the first LED elements 124 and the second LED element 126 to emit the plurality of first color lights L1 and second color light L2. Namely, respective light intensities of the first color lights L1 and the second color light L2 from the first LED elements 124 and the second LED element 126 may be independently controlled to produce an image to be displayed by the display apparatus.

In the embodiment, the first LED elements 124 and the second LED element 126 may be vertical type micro-LEDs, lateral type micro-LEDs or flip-chip type micro-LEDs, which is not limited by the invention.

In the embodiment, the first LED element 124 is a blue micro-LED, and the first color light L1 is a blue light beam. According to some embodiments, a wavelength of the first color light L1 is less than 500 nm. According to some embodiments, the wavelength of the first color light L1 is 455 nm.

In the embodiment, the second LED element 126 is a green micro-LED, and the second color light L2 is a green light beam. A wavelength of the second color light L2 is between 500 nm and 600 nm. According to some embodiments, the wavelength of the second color light L2 is 505 nm.

As shown in FIG. 1, the wavelength conversion module 140 is overlapped on the light source module 120 and located in a light-emitting direction of the first LED elements 124 and the second LED element 126. The wavelength conversion module 140 includes: an isolation structure layer 142, a wavelength conversion element 146 and at least one dichroic filter layer 148.

The isolation structure layer 142 has a first surface 142S1 facing the light source module 120, a second surface 142S2 opposite to the first surface 142S1, and a plurality of light channels 144 penetrating through the first surface 142S1 and the second surface 142S2, in other words, the plurality of light channels 144 penetrating through the isolation structure layer 142. The light channels 144 are respectively disposed in the isolation structure layer 142 in intervals and correspond to the first LED elements 124 and the second LED element 126. In the embodiment, a plurality of light-emitting surfaces of the first LED elements 124 and the second LED element 126 respectively face the light channels 144.

As shown in FIG. 1, the light channels 144 are divided into a first part 144a and a second part 144b. A position of the first part 144a of the light channels 144 corresponds to a first part 124a of the first LED elements 124. An orthogonal projection of the first part 144a of the light channels 144 on the surface 122S1 of the substrate 122 along the Z direction (i.e. a normal direction of the surface 122S1 of the substrate 122) is overlapped with an orthogonal projection of the first part 124a of the first LED elements 124 on the surface 122S1 of the substrate 122 along the Z direction. Therefore, most of the first color lights L1 emitted by the first part 124a of the first LED elements 124 may enter the first part 144a of the light channels 144 along the Z direction and enter the wavelength conversion element 146, and are converted into a converted light beam L3 by the wavelength conversion element 146.

As shown in FIG. 1, the wavelength conversion element 146 is overlapped with the first part 124a of the first LED elements 124 and is disposed in the first part 144a of the light channels 144. As shown in FIG. 1, in the embodiment, the first part 144a of the light channels 144 is, for example, a part of light channels in the light channels 144, and the first part 124a of the first LED elements 124 is, for example, a part of first LED elements in the first LED elements 124, and each light channel of the first part 144a of the light channels 144 corresponds to two first LED elements 124a, and in other embodiments, each light channel of the first part 144a of the light channels 144 may correspond to one first LED element, which is not limited by the invention.

According to some embodiments, a material of the wavelength conversion element 146 is, for example, a quantum dot material or nanophosphor. The wavelength conversion element 146 is configured to absorb the first color lights L1 emitted by the first part 124a of the first light LED elements 124 and excite a converted light beam L3, where a color of the converted light beam L3 is different from that of the first color light L1 and the second color light L2. In the embodiment, the converted light beam L3 is a red light beam. A wavelength of the converted light beam L3 is greater than 600 nm. According to some embodiments, the wavelength of the converted light beam L3 is 625 nm.

As shown in FIG. 1, a position of the second part 144b of the light channels 144 correspond to a second part 124b of the first LED elements 124 and the second LED element 126. As shown in FIG. 1, in the embodiment, the second part 144b of the light channels 144 is, for example, another part of light channels in the light channels 144, and the second part 124b of the first LED elements 124 is, for example, another part of first LED elements in the first LED elements 124. Each light channel of the second part 144b of the light channels 144 corresponds to one first LED element 124b and one second LED element 126, but the invention is not limited thereto. An orthogonal projection of the second part 144b of the light channels 144 on the surface 122S1 of the substrate 122 along the Z direction is overlapped with an orthogonal projection of the second part 124b of the first LED elements 124 on the surface 122S1 of the substrate 122 along the Z direction and an orthogonal projection of the second LED element 126 on the surface 122S1 of the substrate 122. Therefore, the first color lights L1 emitted by the other part 124b of the first LED elements 124 and the second color light L2 emitted by the second LED element 126 may penetrate the second part 144b of the light channels 144 along the Z direction.

In the embodiment, the second part 144b of the light channels 144 is a cavity penetrating through the isolation structure layer 142 or filled with a transparent material. Namely, the wavelength conversion element 146 is not disposed in or above the second part 144b of the light channels 144. According to some embodiments, the transparent material filled in the second part 144b of the light channels 144 is, for example, a photoresist material or an optical adhesive material that allows the first color lights L1 and the second color light L2 to pass through directly, but the invention is not limited thereto.

In order to make the intensities of the red light, blue light and green light emitted by the display device 100 to be equivalent, a quantity ratio of the part 124a of the first LED elements 124 (used for emitting the first color lights L1 with blue color that excites the wavelength conversion element 146), the second part 124b of the first LED elements 124 (used for emitting the first color lights L1 with blue color) and the second LED element 126 (used for emitting the second color light L2 with green color) is 2:1:1.

In the embodiment, a material of the isolation structure layer 142 may include a light-absorbing material, a metal material with high reflectivity or a non-metallic material with high reflectivity, such as black resin, white resin, or other suitable light-absorbing or reflective materials, but the invention is not limited thereto. In some embodiments, when optical paths of the first color lights L1 emitted by the first LED elements 124, the second color light L2 emitted by the second LED element 126, and the converted light beam L3 excited from the wavelength conversion element 146 by absorbing the first color lights L1 emitted by the first part 124a of the first LED elements 124 and a normal direction of the first surface 142S1 of the isolation structure layer 142 have a larger included angle, the first color light L1, the second color light L2 and the converted light beam L3 are easily absorbed or reflected by the isolation structure layer 142. Accordingly, light output concentration of each light channel 144 may be effectively improved, thereby improving display quality (for example, image clarity).

As shown in FIG. 1, at least one dichroic filter layer 148 is disposed on one side of the second surface 142S2 of the isolation structure layer 142 and is overlapped with the wavelength conversion element 146, i.e., the at least one dichroic filter layer 148 only corresponds to the wavelength conversion element 146. In the embodiment, a number of the at least one dichroic filter layer 148 is one. According to some embodiments, the dichroic filter layer 148 is a metal thin film with a thickness of less than 5 µm, preferably less than 3 µm, and is formed on the transparent glass sheet 150 by means of coating. In the embodiment, the dichroic filter layer 148 has an obvious reflection effect on light beams with wavelengths less than 500 nm. Namely, a transmittance of the dichroic filter layer 148 to the first color lights L1 with wavelengths of less than 500 nm is less than 50%. On the other hand, the transmittance of the dichroic filter layer 148 to red light, i.e., the converted light beam L3, is greater than 90%. Therefore, the first color lights L1 emitted by the first part 124a of the first LED elements 124 are converted into the converted light beam L3 by the wavelength conversion element 146 in the light channels 144a, and the converted light beam L3 may penetrate through the dichroic filter layer 148. A part of the first color lights L1 that cannot be effectively absorbed by the wavelength conversion element 146 is reflected back to the wavelength conversion element 146 by the dichroic filter layer 148. Therefore, through the dichroic filter layer 148, a red light component in the converted light beam L3 may be increased, and a blue light component in the converted light beam L3 may be reduced, so that the converted light beam L3 which is output from the dichroic filter layer 148 has better color purity.

Moreover, the dichroic filter layer 148 has a plurality of openings 148a, and the openings 148a are overlapped with the second part 144b of the light channels 144, and the openings 148a may define light-transmitting regions of the dichroic filter layer 148. Namely, the dichroic filter layer 148 is not disposed above the second part 144b of the light channels 144. Therefore, after the first color lights L1 emitted by the second part 124b of the first LED elements 124 and the second color light L2 emitted by the second LED element 126 pass through the second part 144b of the light channels 144, the first color lights L1 and the second color light L2 may pass through the openings 148a without being reflected by the dichroic filter layer 148. Namely, the first color lights L1 for displaying blue and the second color light L2 for displaying green in the display device 100 may pass through the openings 148a without being reflected by the dichroic filter layer 148.

As shown in FIG. 1, the display element 100 further includes a transparent glass sheet 150. The transparent glass sheet 150 is located above the wavelength conversion module 140, and the transparent glass sheet 150 is disposed on, for example, the second surface 142S2 of the isolation structure layer 142 and is overlapped with the light channels 144. The dichroic filter layer 148 of the wavelength conversion module 140 is located between the transparent glass sheet 150 and the isolation structure layer 142.

As shown in FIG. 1, the display element 100 further includes a microlens structure layer 152. The microlens structure layer 152 is located on the transparent glass sheet 150 and is overlapped with the light channels 144. The microlens structure layer 152 includes a plurality of microlenses 154 arranged in an array, and positions of the microlenses 154 respectively correspond to the light channels 144 for respectively converging or collimating the first color lights L1, the second color light L2 and the converted light beam L3 penetrating through the at least one dichroic filter layer 148.

According to some embodiments, a cross-sectional profile of the microlens 154 of the microlens structure layer 152 on a plane (i.e., an XZ plane) perpendicular to an extending direction (for example, a Y direction) may be semi-elliptical or semi-circular. Namely, the microlens 154 in the embodiment may be a lenticular lens strip extending along the Y direction, but the invention is not limited thereto. In other embodiments, the cross-sectional profile of the microlens 154 on the plane perpendicular to the extending direction may also be adjusted according to an actual light type requirement (or light splitting effects). For example, the cross-sectional profile of the microlens 154 may be may be a wedge-shape, an (oblique) triangular lens strip, but the invention is not limited thereto. In other embodiments, the cross-sectional profile of the microlens 154 may also be adjusted according to actual light type requirements (or light splitting effects). In other embodiments, an orthogonal projection of each microlens 154 of the microlens structure layer 152 on the surface 122S1 of the substrate 122 along the Z direction is, for example, a circle, and the microlenses 154 correspond to the light channels 144 in a one-to-one manner.

As shown in FIG. 1, the display device 100 further includes an encapsulation material 156 located on the transparent glass sheet 150 for covering the microlens structure layer 152. According to some embodiments, a material of the encapsulation material 156 may be an optical adhesive material that allows the first color lights L1, the second color light L2, and the converted light beam L3 to pass through, but the invention is not limited thereto.

Figure 2:
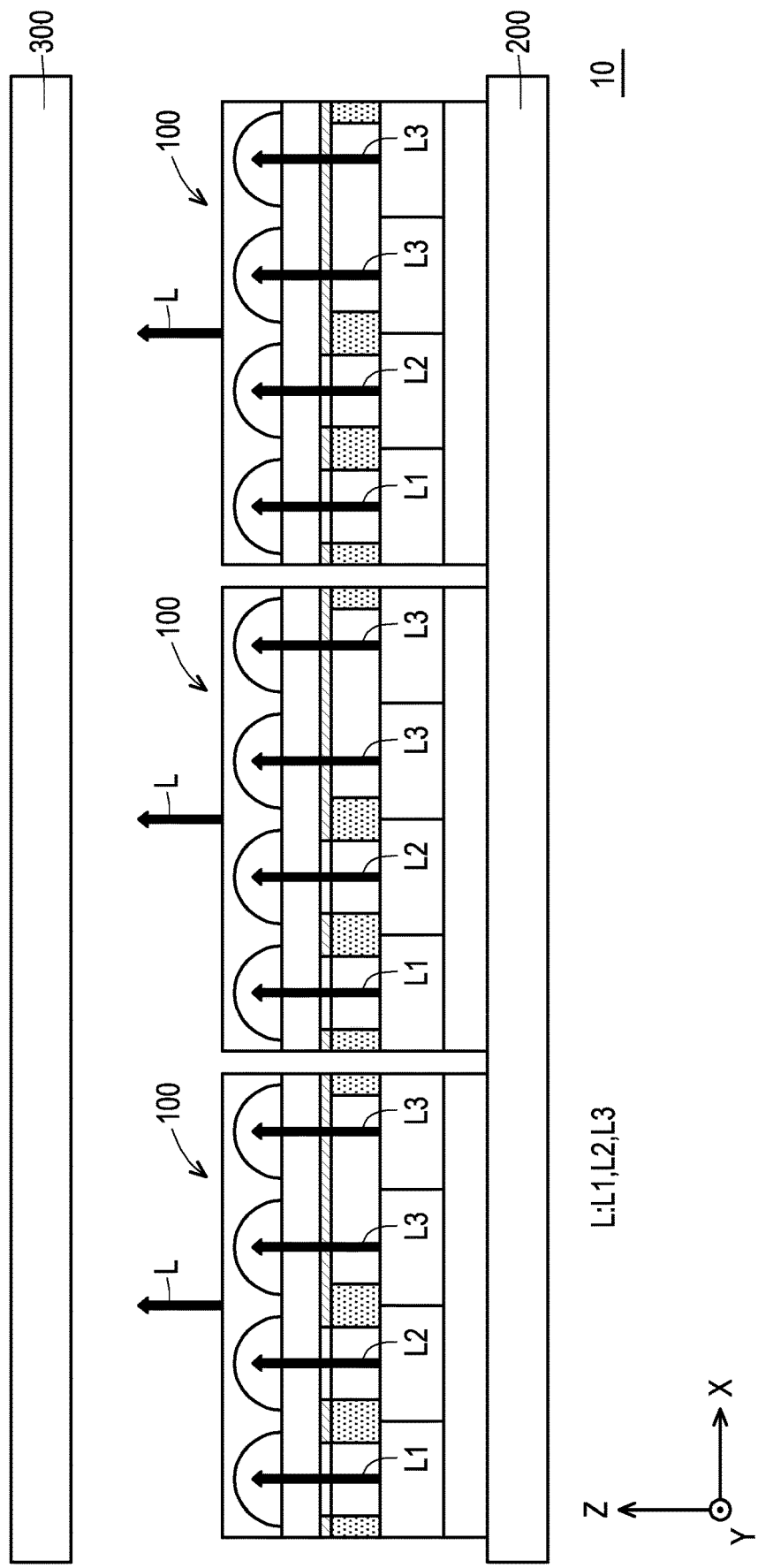
FIG. 2 is a schematic diagram of a display apparatus according to an embodiment of the invention.

FIG. 2 is a schematic diagram of a display apparatus according to an embodiment of the invention.

A display apparatus 10 includes a plurality of display devices 100, a plate 200 and a transparent substrate 300. The plurality of display devices 100 are arranged on the plate 200 in an array, and are suitable for providing illumination light beams L. The illumination light beams L include the first color lights L1, the second color light L2 and the converted light beam L3 emitted by each display device 100. The transparent substrate 300 is located on a transmission path of the illumination light beams L provided by the plurality of display devices 100, and may display images under irradiation of the illumination light beams L.

In summary, in the display device of the invention, the display device uses blue and green micro-LEDs as light sources, and only uses red quantum dot material to perform color conversion on the blue lights emitted by the blue micro-LEDs, thereby achieving a miniature full-color screen, which may effectively reduce a manufacturing process, improve a product yield and reduce the production cost. The display apparatus 10 using the display devices 100 may also present images with good image quality and brightness through the illumination light beam L provided by the display devices 10.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents. Moreover, any embodiment of or the claims of the invention is unnecessary to implement all advantages or features disclosed by the invention. Moreover, the abstract and the name of the invention are only used to assist patent searching. Moreover, "first", "second", etc. mentioned in the specification and the claims are merely used to name the elements and should not be regarded as limiting the upper or lower bound of the number of the components/devices.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display device, comprising a light source module and a wavelength conversion module, wherein
the light source module comprises a substrate, a plurality of first light-emitting diodes and a second light-emitting diode, wherein the plurality of first light-emitting diodes and the second light-emitting diode are arranged on a surface of the substrate in an array, the plurality of first light-emitting diodes are configured for providing a plurality of first color lights, and the second light-emitting diode is configured for providing a second color light; and
the wavelength conversion module is overlapped and arranged on the light source module, and the wavelength conversion module comprises an isolation structure layer, a wavelength conversion element and at least one dichroic filter layer, wherein,
the isolation structure layer has a first surface facing the light source module and a second surface opposite to the first surface, and a plurality of light channels penetrating through the first surface and the second surface, and the plurality of first light-emitting diodes and the second light-emitting diode respectively correspond to the plurality of light channels;
the wavelength conversion element is overlapped with a part of the plurality of first light-emitting diodes and is disposed in a first part of the plurality of light channels, and an orthogonal projection of the first part of the plurality of light channels on the surface of the substrate is overlapped with an orthogonal projection of the part of the plurality of first light-emitting diodes on the surface of the substrate, the wavelength conversion element is configured to absorb at least part of the plurality of first color lights emitted by the part of the plurality of first light-emitting diodes and excite a converted light beam, wherein a color of the converted light beam is different from that of the plurality of first color lights and the second color light;

the at least one dichroic filter layer is disposed on the second surface of the isolation structure layer and is overlapped with the wavelength conversion element, wherein the converted light beam penetrates through the at least one dichroic filter layer, and the at least one dichroic filter layer reflects another part of the plurality of first color lights emitted by the part of the plurality of first light-emitting diodes and not absorbed by the wavelength conversion element back toward the wavelength conversion element.

2. The display device according to claim 1, wherein the plurality of first light-emitting diodes are blue micro light-emitting diodes, and the plurality of first color lights are blue light beams.

3. The display device according to claim 1, wherein the second light-emitting diode is a green micro light-emitting diode, and the second color light is a green light beam.

4. The display device according to claim 1, wherein the converted light beam is a red light beam.

5. The display device according to claim 1, wherein wavelengths of the plurality of first color lights are less than 500 nm.

6. The display device according to claim 1, wherein a wavelength of the second color light is between 500 nm and 600 nm.

7. The display device according to claim 1, wherein a wavelength of the converted light beam is greater than 600 nm.

8. The display device according to claim 1, wherein a material of the isolation structure layer comprises a light absorbing material, a metal material with high reflectivity or a non-metal material with high reflectivity.

9. The display device according to claim 1, wherein the wavelength conversion element is quantum dot material or nanophosphor.

10. The display device according to claim 1, further comprising: a transparent glass sheet located on the second surface of the isolation structure layer, the transparent glass sheet is overlapped with the plurality of light channels, and the at least one dichroic filter layer is located between the transparent glass sheet and the isolation structure layer.

11. The display device according to claim 10, further comprising: a microlens structure layer, wherein the microlens structure layer comprises a plurality of microlenses arranged in an array, and positions of the microlenses respectively correspond to the plurality of light channels for respectively converging or collimating the plurality of first color lights, the second color light and the converted light beam penetrating through the at least one dichroic filter layer.

12. The display device according to claim 1, wherein a quantity ratio of the part of the plurality of first light-emitting diodes, another part of the plurality of first light-emitting diodes and the second light-emitting diode is 2:1:1.

13. The display device according to claim 1, wherein an orthogonal projection of a second part of the plurality of light channels on the surface of the substrate is overlapped with an orthogonal projection of another part of the plurality of first light-emitting diodes and the second light-emitting diode on the surface of the substrate, and the second part of the plurality of light channels is a cavity, or filled with a transparent material.

14. A display apparatus, comprising a plate and a plurality of display devices arranged on the plate in an array, wherein each of the plurality of display devices comprises a light source module and a wavelength conversion module, wherein the light source module comprise a substrate, a plurality of first light-emitting diodes and a second light-emitting diode, wherein the plurality of first light-emitting diodes and the second light-emitting diode are arranged on a surface of the substrate in an array, the plurality of first light-emitting diodes are configured for providing a plurality of first color lights, and the second light-emitting diode is configured for providing a second color light; and the wavelength conversion module is overlapped and arranged on the light source module, and the wavelength conversion module comprises:

an isolation structure layer, a wavelength conversion element and at least one dichroic filter layer, wherein the isolation structure layer has a first surface facing the light source module and a second surface opposite to the first surface, and a plurality of light channels penetrating through the first surface and the second surface, and the plurality of first light-emitting diodes and the second light-emitting diode respectively correspond to the plurality of light channels, the wavelength conversion element is overlapped with a part of the plurality of first light-emitting diodes and is disposed in a first part of the plurality of light channels, and an orthogonal projection of the first part of the plurality of light channels on the surface of the substrate is overlapped with an orthogonal projection of the part of the plurality of first light-emitting diodes on the surface of the substrate, the wavelength conversion element is configured to absorb the plurality of first color lights emitted by the part of the plurality of first light-emitting diodes and excite a converted light beam, wherein a color of the converted light beam is different from that of the plurality of first color lights and the second color light, and the at least one dichroic filter layer is disposed on the second surface of the isolation structure layer and is overlapped with the wavelength conversion element, wherein the converted light beam penetrates through the dichroic filter layer, and the dichroic filter layer reflects another part of the plurality of first color lights emitted by the part of the plurality of first light-emitting diodes and not absorbed by the wavelength conversion element back toward the wavelength conversion element.

15. The display apparatus according to claim 14, wherein the plurality of first light-emitting diodes are blue micro light-emitting diodes, the plurality of first color lights are blue light beams, the second light-emitting diode is a green micro light-emitting diode, the second color light is a green light beam, and the converted light beam is a red light beam.

16. The display apparatus according to claim 14, wherein a quantity ratio of the part of the plurality of first light-emitting diodes, another part of the plurality of first light-emitting diodes and the second light-emitting diode is 2:1:1.

17. The display apparatus according to claim 14, wherein the wavelength conversion element is quantum dot material or nanophosphor.

18. The display apparatus according to claim 14, wherein each of the plurality of display devices further comprises: a transparent glass sheet located on the second surface of the isolation structure layer, the transparent glass sheet is overlapped with the plurality of light channels, and the at least one dichroic filter layer is located between the transparent glass sheet and the isolation structure layer.

19. The display apparatus according to claim 14, wherein each of the plurality of display devices further comprises: a microlens structure layer, the microlens structure layer comprises a plurality of microlenses arranged in an array, and positions of the microlenses respectively correspond to the plurality of light channels for respectively converging or collimating the plurality of first color lights, the second color light and the converted light beam penetrating through the at least one dichroic filter layer.

20. The display apparatus according to claim 14, wherein an orthogonal projection of a second part of the plurality of light channels on the surface of the substrate is overlapped with an orthogonal projection of another part of the plurality of first light-emitting diodes and the second light-emitting diode on the surface of the substrate, and the second part of the plurality of light channels is a cavity, or filled with a transparent material.

* * * * *